United States Patent [19]

Francis et al.

[11] 4,155,815

[45] May 22, 1979

[54] METHOD OF CONTINUOUS ELECTROPLATING AND CONTINUOUS ELECTROPLATING MACHINE FOR PRINTED CIRCUIT BOARD TERMINALS

[76] Inventors: William L. Francis, 3409 Greenview Dr.; William L. Renshaw, 3410 Deerwood Dr., both of New Albany, Ind. 47150; Steven P. Hartley, Rte. 2, Box 578, Georgetown, Ind. 47122

[21] Appl. No.: 892,694

[22] Filed: Apr. 3, 1978

[51] Int. Cl.² .................. C25D 5/02; C25D 17/00; C25D 17/06; C25D 17/28

[52] U.S. Cl. ............................ 204/15; 204/198; 204/203; 204/224 R

[58] Field of Search ............ 204/224 R, 198, 202, 204/203, 206, 15

[56] References Cited

U.S. PATENT DOCUMENTS

| | | | |
|---|---|---|---|
| 3,274,092 | 9/1966 | Marantz | 204/224 R |
| 3,657,097 | 4/1972 | Baldock et al. | 204/224 R |
| 3,723,283 | 3/1973 | Johnson et al. | 204/224 R |
| 3,746,630 | 7/1973 | Kosowsky et al. | 204/224 R |
| 3,933,615 | 1/1976 | Levenson | 204/275 |
| 3,966,581 | 6/1976 | Holte | 204/224 R |
| 4,029,564 | 6/1977 | Higuchi et al. | 204/224 R |

Primary Examiner—T. M. Tufariello
Attorney, Agent, or Firm—Price and Caslin

[57] ABSTRACT

A continuous plating machine using a cooperating pair of endless tractor tread conveyor means to transport printed circuit boards through a plurality of process stations to complete stripping, cleaning, activation, plating and intermediate rinse cycles of the board terminals. The PC boards are captured between the opposing treads or shoes which serve as a masking means to protect the portions of the boards that don't require plating. The boards are electrically connected back through the conveyor means to the electrical current source.

26 Claims, 8 Drawing Figures

METHOD OF CONTINUOUS ELECTROPLATING AND CONTINUOUS ELECTROPLATING MACHINE FOR PRINTED CIRCUIT BOARD TERMINALS

BACKGROUND OF THE INVENTION

1. Field of the Invention

This invention relates to a continuous electroplating machine for plating the tabs or terminals along one edge of a rectangular plate such as a printed circuit board, as the boards are conveyed through the machine. This invention has an improved conveyor means and improved mechanical masking means.

2. Description of the Prior Art

It is known in the electroplating art to cover portions of a printed circuit board which should not be plated with a thin synthetic resin film and the peripheral portions are masked with adhesive tapes, and the board is dipped in a level controlled electroplating solution and charged with electricity for plating.

The printed circuit board terminals are copper plated and they need to be furnished with a hard wear resistant surface having good electrical conductive properties by first applying a nickel plating and then a gold plating to the terminals.

This dipping method is slow and it requires preliminary preparations prior to the plating operation which adds to the cost of labor and materials. Plating at a high current density is impossible for the dipping method so that it takes a long period of time to obtain the required thickness of the plated deposit. This dipping method is further defective in that the thickness of the plating deposit is often uneven depending upon the location of the object to be plated, the distance between the anodes and cathodes, the condition of the electrolyte agitation and because all of these conditions are very hard to control.

The recent Higuchi et al U.S. Pat. No. 4,029,564 describes a batch feed, electroplating machine for gold plating the terminals of printed circuit boards, one board at a time. This prior art plating machine uses a mechanical masking means to protect the portions of the PC board not requiring plating. This masking means comprises a pair of opposed plates having masking sheets on the facing sides thereof, and pressure cylinder means coacting with the plates for clamping the PC board therebetween. This patent also has replaced the old dipping method of plating the terminals by jetting the plating solution onto the board terminals. This Higuchi et al machine is a one step process machine and it fails to provide a continuous movement of boards through the machine for complete processing; including stripping, cleaning, activation, plating and rinse cycles. Also the Higuchi et al machine fails to provide quick equipment interchangeability to handle the processing of boards of various thicknesses and sizes. Moreover, this prior art design does not provide absolute shielding or masking of board side edges from plating solutions. These exposed edges allow tin-lead contamination to enter the solution which eventually leads to serious damage to the plating baths. Likewise the method of solution movement in the Higuchi et al. machine lends itself to localized "richness" in comparison to the method of the present invention which encourages uniform metal content distribution over the full length of the manifold.

In the Johnson et al U.S. Pat. No. 3,723,283 there is a plating system for a continuous strip or web of work material rather than individual sheetlike workpieces as are accomodated by the plating machine of the present invention. In FIGS. 11 and 12 of this Johnson et al. patent the continuously moving web passes between two flexible belt-like gaskets which are not motor-driven, but merely free wheeling so as to be trackable over the surfaces of the web. The gaskets have apertures, and there is an electrolyte entrance header within one gasket and an electrolyte exit header within the other gasket to the electrolyte passes through one gasket, through the web and out through the other gasket whereby the gaskets shield or mask the web in areas that are not to be plated.

The Holte U.S. Pat. No. 3,966,581 shows apparatus for the continuous electroplating of selected portions of discrete electronic components. The components are carried by a conveyor belt which is electrically conductive and has spaced openings for receiving the component bodies in nesting relationship. An insulating belt sandwiches and thereby retains the components in their nested positions to maintain the achieved electrical continuity.

OBJECTS OF THE PRESENT INVENTION

The principal object of the present invention is to provide an electroplating machine or apparatus with a continuous conveyor or transfer system which can accomodate printed circuit boards of different sizes and thicknesses.

A further object of the present invention is to provide a continuous electroplating machine of the class described using a conveyor of two interacting, endless tractor treads which capture the printed circuit boards therebetween and move the boards along as the treads are turned by motor power.

A further object of the present invention is to provide an electroplating machine of the class described where the endless conveyor is able to mask or shield the portions of the workpiece not requiring processing or plating.

A further object of the present invention is to provide a high-speed conveyorized electroplating machine for the terminals of PC boards through entire stripping, cleaning, activation, plating and rinse cycles.

Still another object of this invention is the provision of an improved clamping shoe for each of said endless tractor tread, said shoes having an inner dielectric clamping face, an electrically conductive pad across a portion of said clamping face, and electrically conductive means in operative relation with said pad for impressing a negative charge on the workpiece captured between the clamping faces of said treads.

SUMMARY OF THE INVENTION

The present invention provides a continuous plating machine having an interacting endless tractor tread conveyor means which captures a plurality of discrete sheet-like workpieces therebetween transports them therealong with a selected lengthwise portion to be plated extending outwardly of the tread means. This lengthwise portion contains electrical terminals to be plated. The conveyor means includes backup guide means for the clamping portion of the tread means which opposes the other tread means in capturing the workpiece therebetween. The workpiece serves as the cathode means of the electroplating process and the workpiece is electrically connected back through the conveyor means to the current source.

BRIEF DESCRIPTION OF THE DRAWINGS

This invention will be better understood from the following description taken in conjunction with the accompanying drawings and its scope will be pointed out in the appended claims.

DESCRIPTION OF THE PREFERRED EMBODIMENTS

Figure 1:
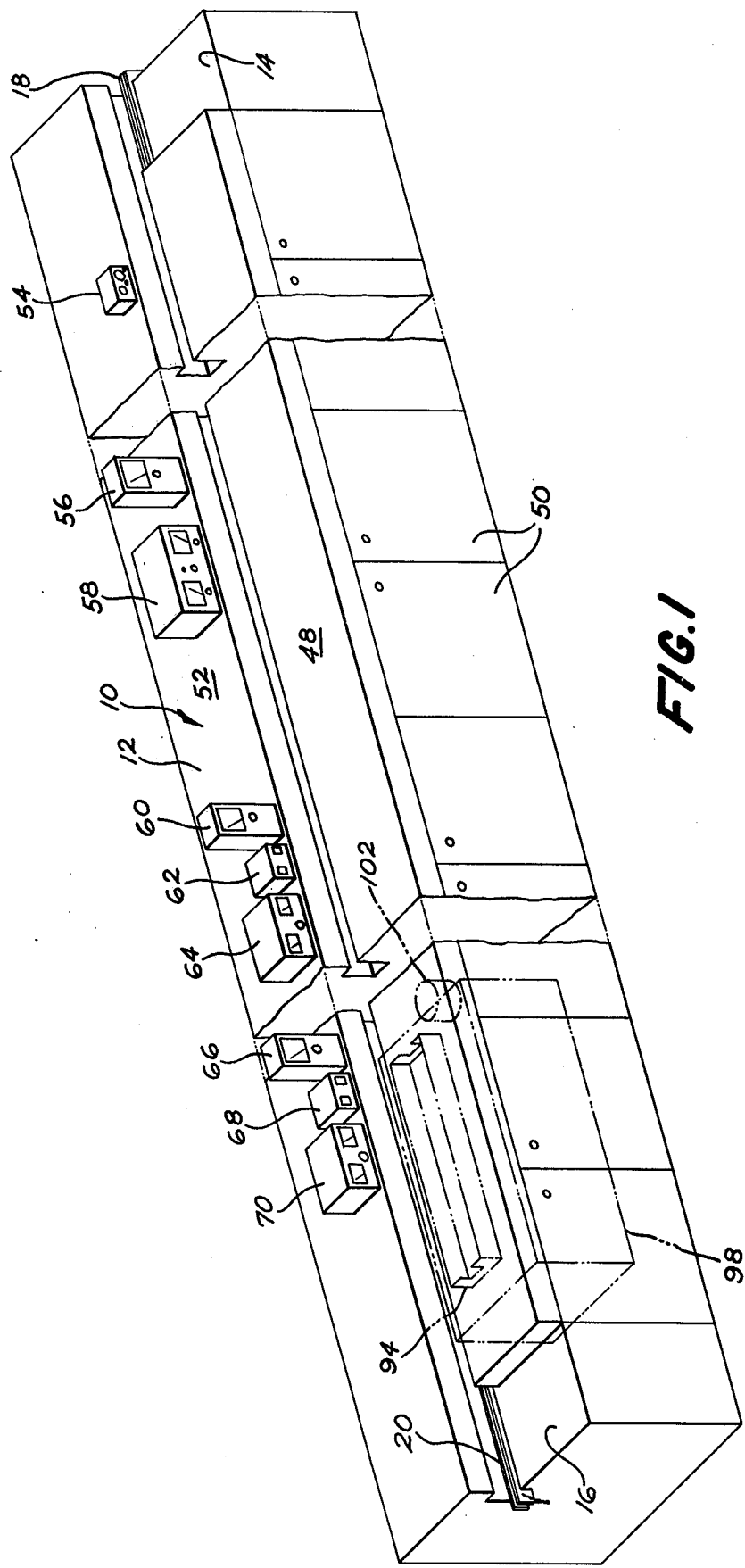
FIG. 1 is a perspective view of an elongated, continuous, automatic plating machine for the terminals of printed circuit boards according to the present invention, having a plurality of process stations, and furnished with an overall cabinet structure to enclose the plating machinery from interference and contamination.

Turning now to a consideration of the drawings and, in particular, to the overall perspective view of the entire automatic plating machine 10 of FIG. 1, there is shown an elongated cabinet structure 12 which may extend for a long distance, on the order of thirty feet and it shields the plating machinery from interference and contamination.

The starting point or loading end of the machine is at the right end 14, while the finish or unloading end is at the left end 16. At the loading end 14 is a track 18 in which the sheet-like workpieces may be arranged in close, upright, side by side relationship. At the unloading end 16 there is a track 20 where the finished products are delivered. A longitudinal conveyor, which forms part of the present invention but is not shown in this FIG. 1, connects the loading track 18 with the unloading track 20. This longitudinal conveyor 24 is best shown in plan view in FIG. 4. The conveyor comprises a pair of interacting tractor treads 26 and 28, where each tread has an endless chain 30 and 32 respectively, and in turn each chain has a plurality of treads or shoes 34 and 36 respectively. Each chain 30 and 32 is mounted around a pair of sprocket sheets 38,38 and 40,40 respectively. Both tractor treads 26 and 28 are mounted to act against the other in a clamping and driving relationship, and the workpiece 44 is shown captured therebetween.

More information will be furnished on the conveyor 24 hereinafter. Turning back to the overall assembly view of FIG. 1, the cabinet 12 is provided with a waist-high counter area 48 with lower access doors 50 and an elevated shelf area 52, which supports a plurality of control modules 54, 56, 58, 60, 62, 64, 66, 68 and 70.

There are a plurality of process stations which are described below in a general manner:

Load boards.

Station 1—Strip. Commercial acid solution strips off the tin-lead solder residue.

Station 2—Tap water rinse and air dry.

Station 3—Scrub. Uses stiff brushes in water solution. Control 54 in a pressure gauge for this station.

Station 4—Tap water rinse and air dry.

Station 5—Acid. Using either hydrochloride or sulphuric.

Station 6—Nickel plate. Control 56 represents a heater regulator meter, and control 58 is a rectifier control.

Station 7—Tap water rinse and air dry.

Station 8—Gold Strike. Applies 5 micro inches of soft gold to the workpiece terminals. Control 60 is a meter for the heater, 62 is an amp-hour meter, and 64 is the rectifier control.

Station 9—Tap water rinse and air dry.

Station 10—Gold Plate. Applies 100 micro inches of hard gold. Control 66 is a meter box for the heater, 68 is an amp-hour meter and 70 is the rectifier control.

Station 11—Dragout Rinse. Uses a precious metal recovery system to capture any gold in the solution.

Station 12—Dry. Uses a drying chamber.

Unload boards.

Figure 2:
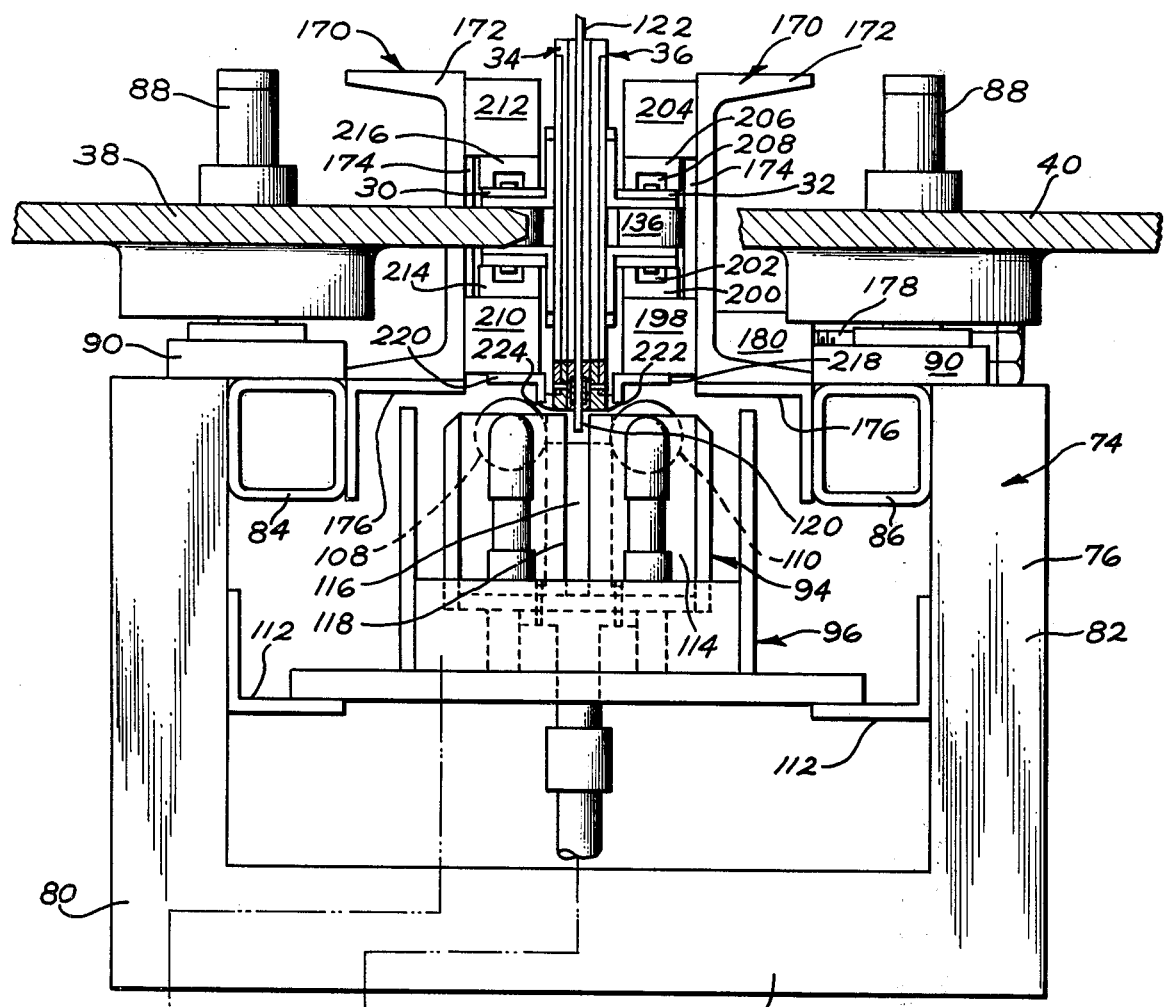
FIG. 2 is a fragmentary transverse, cross-sectional, elevational view through a plating station of the machine of FIG. 1 showing a PC board clamped between the opposing shoes of a double tractor tread conveyor, and the lower edge of the board extends down into an overflowing plating cell which is continuously furnished with plating solution. The conveyor shoes or treads are supported on endless chains which are driven by sprocket wheels.

Turning now to a consideration of the transverse, cross-sectional, elevational view of FIG. 2, there is shown a base frame 74 comprising a heavy U-shaped end wall 76 of box beam construction at each end of the machine. Each end wall has a bottom portion 78 and two vertical side portions 80 and 82. The end walls 76 are joined by two elongated box beams 84 and 86 that are welded to the top of the inner side of the vertical side portions 80 and 82. The sprocket wheels 38 and 40 are each assembled on a vertical stub shaft 88 that is seated in a bearing block 90 on the top of the base frame.

Beneath the top of the base frame 74 is a plating cell 94 of narrow, elongated box-like configuration for containing the electrolyte or plating solution which floods the cell and overflows its walls. The cell is positioned within an overflow tank 96 which drains into a reservoir or solution holding tank 98 which is shown diagrammatically below the base frame 74. A drain line 100 connects the overflow tank 96 to the holding tank 98. A motor-pump unit 102 is provided with the holding tank to return the plating solution 104 to the plating cell 94 by means of feeder 106. The cell 94 has a pair of elongated sparge tubes 108 and 110 that extend for the length of the cell. These tubes are fed solution from the feeder line 106. Each tube 108 and 100 is furnished with a plurality of small holes that are located on the side nearest the other tube and extend generally in a straight line for the length of the tube. These tubes 108 and 110 serve to supply solution to the cell and flood the cell until it overflows. Such a treatment provides a constant agitation of the solution to displace the solution and provide a quicker plating reaction.

The plating cell 94 is supported within the overflow tank 96 which in turn is supported from the angle irons 112 that are attached to the vertical side posts 80 and 82.

Each end wall 114 has a removable weir plate 116 fitted into a vertical slot 118. The sides 1 of the slot 118 are grooved to receive the weir plate 116 therein and prevent the plating solution from leaking out of the cell. The top of the weir plate stops short of the top of the slot 118 to define the overflow level of the cell and allow the terminal edge 120 of the workpiece or PC board 122 to dip into and pass through the cell as the board is carried by the conveyor 24 through the machine 10.

Figure 4:
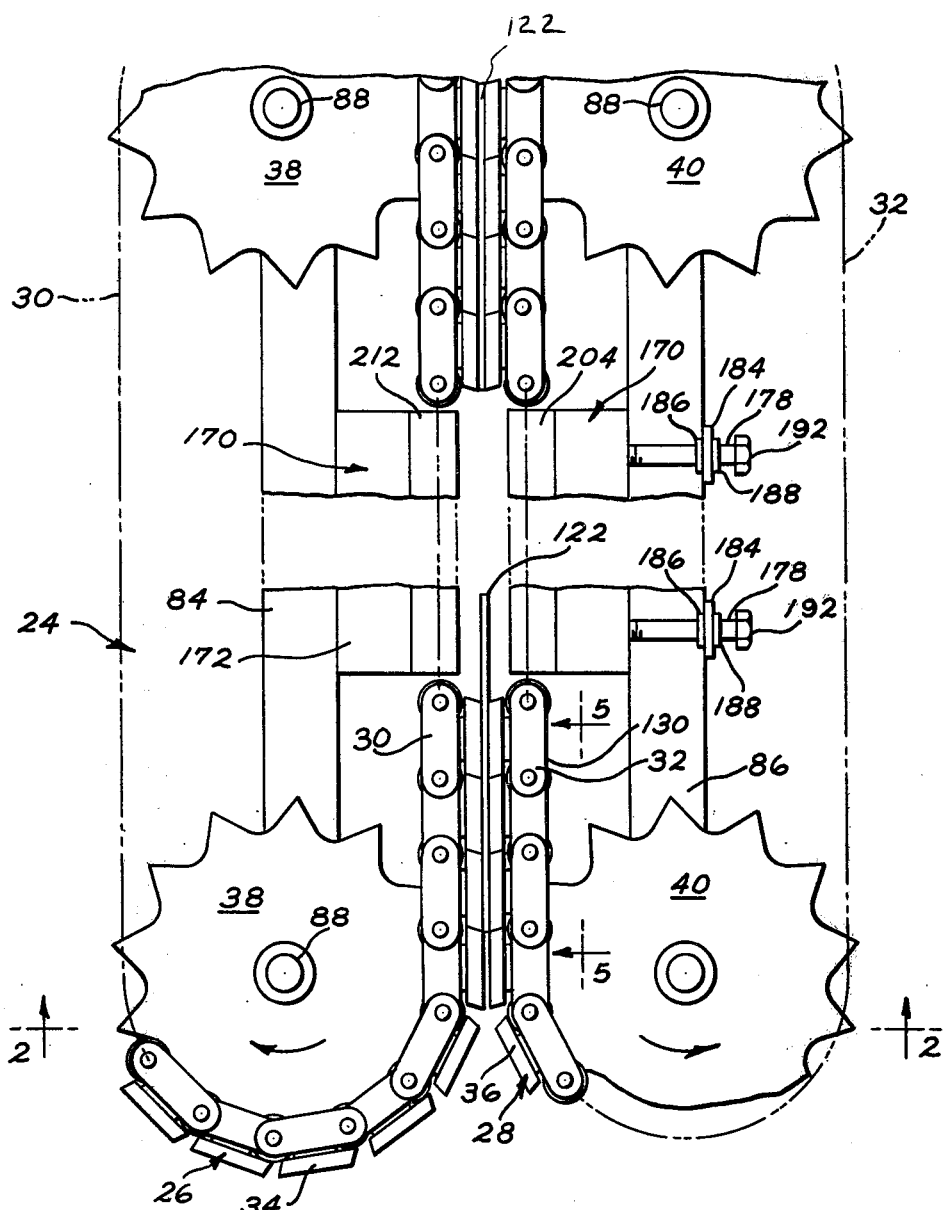
FIG. 4 is a fragmentary, plan view of an elongated conveyor means formed by a pair of opposed, endless, tractor treads that act against each other to capture the workpiece or file of PC boards therebetween. This conveyor extends for nearly the complete length of the automatic plating machine of FIG. 1, on the order of thirty feet. Notice that the transverse cross-sectional, elevational view is taken generally on the broken line 2—2 of this FIG. 4.
Figure 5:
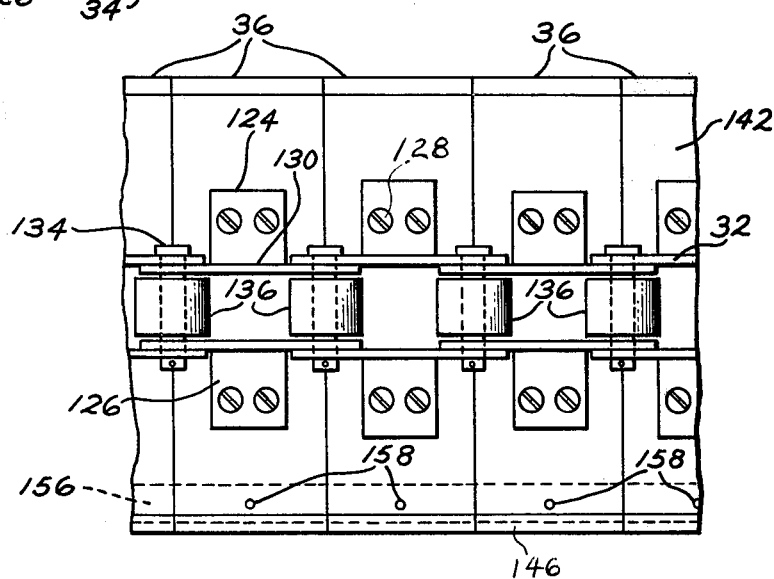
FIG. 5 is a fragmentary, elevational rear view of a clamping portion of one of the endless chains taken on the line 5—5 of FIG. 4 and showing how the vertical sides of the clamping shoes engage each other along adjacent sides when the shoes are in a workpiece clamping position.

Turning back to the conveyor 24 in the top plan view of FIG. 4 and the rear elevational view of FIG. 5 each shoe or tread 34 or 36 is provided with a pair of angle brackets 124 and 126 which are attached to the rear of the shoe by fasteners 128 and form links 130 of the endless chain 24. Each adjacent link 130 is joined by a pivot pin 134. The center portion of the pivot pin is provided with an oversize roller 136 for sliding engagement with the teeth of the sprocket wheels 38 or 40. Thus the links 130, pins 134 and rollers 136 form an endless chain 24 which is mounted between the two sprockets 38, 38 and 40, 40.

Figure 3:
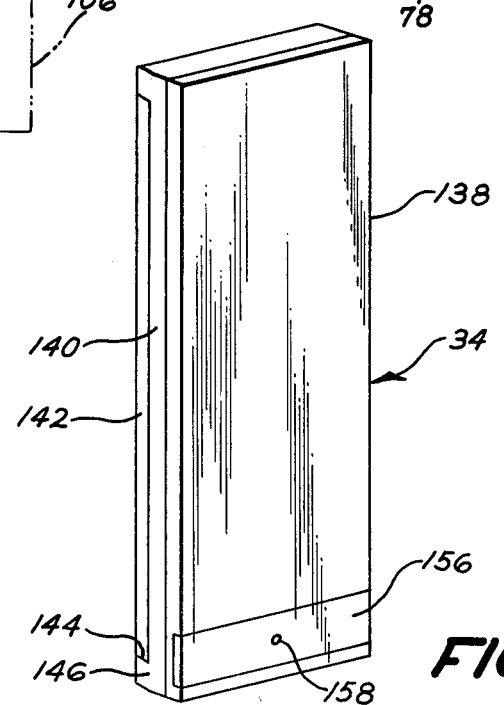
FIG. 3 is an enlarged perspective view of a single conveyor shoe showing the resilient front clamping face with a lower pad or electrode adjacent the bottom of the shoe for making electrical contact with the printed circuit of the board or workpiece so the board has a negative charge and serves as the cathode of the electroplating process.

Turning to the detail showing of a single shoe or tread 34 or 36 in FIG. 3, the front face 138 is a resilient rubber pad, that is backed by an insulating layer 140 of high molecular weight and machinability such as Delrin ® resin or the like. The back of the shoe is furnished with a metal plate 142. It is this metal plate 142 that receives the fastening screws 128 of the shoe angle brackets. Notice in FIG. 3 that the metal plate 142 stops short of the top and bottom edge of the shoe. Moreover, the rear face of the Delrin resin layer 140 is machined to receive the metal plate therein so the lower edge 144 of the metal plate will be insulated by the flange 146. Hence, this lower metal edge 144 will be insulated from the plating solution 104 overflowing from the plating cell 94 and thus will not become plated by the solution.

Figure 8:
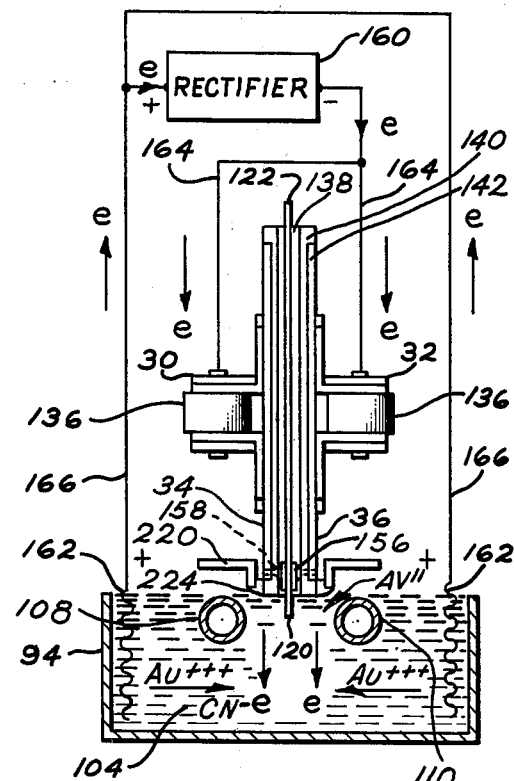
FIG. 8 is a schematic diagram of a gold plating cell showing the workpiece or PC board as the cathode and platinum plated titanium screens along the sides of the cell serving as the anodes, as well as the electrical connections from the rectifier or other power source, through the conveyor means to the workpiece, through the plating solution to the anodes and back to the rectifier.

It is necessary to make an electrical connection between each shoe 34 or 36 and each PC board 122. This is best shown in FIGS. 2 and 3. The inner face of each shoe is dielectric and comprises a front layer of resilient rubber 138. This dielectric layer of rubber 138 has at its lower edge portion a small pad 156 of silver impregnated conductive rubber which serves as an electrode to connect the printed circuit so as to charge the terminals 154. As is best seen in FIGS. 2 and 8, an electrically conductive metal fastener or bolt 158 is in conductive relationship with this pad and the bolt 158 extends through the dielectric layer of rubber 138 and is joined to the negatively charged metal plate 142.

A continuous negative electrical charge is placed on each chain 30 and 32 through a conventional spring bias wiper or trolley (not shown) so as to negatively charge the entire tractor tread conveyor. The dielectric inner layer of rubber 138 insulates the inner face of the shoes from the rest of the apparatus. The terminals 154 of the workpiece or PC board 122 are negatively charged through contact with the printed circuit with the silver impregnated rubber pads 156 in gripping relationship therewith. Electrical contact of the conductive pads 156 with chains 30 or 32 is through the electrically conductive bolts or fasteners 158 to the outer electrically conductive metal base 142 and thence to the chains 30 to the rectifier or power source 160 through a conventional spring bias wiper or trolley (not shown). As is shown in FIGS. 2 and 8 the anodes 162 are platinum plated titanium screens which connect by means of leads 166 to the rectifier 160. Leads 164 join the rectifier 160 to the two chains 30 and 32 through backing plate 142 and thence through electrically conductive metal bolts 158 to the silver impregnated rubber pads 156. Thus the electrons flow from the rectifier through leads 164 to the chains 30 and 32 and thence via the electrical connection afforded by electrically conductive bolt 158 to the conductive pads 156 to the workpiece or cathode 122 and enter the plating solution 104. The electrons leave the solution at the anodes 162 and flow through leads 166 back to the rectifier 160.

Figure 6:
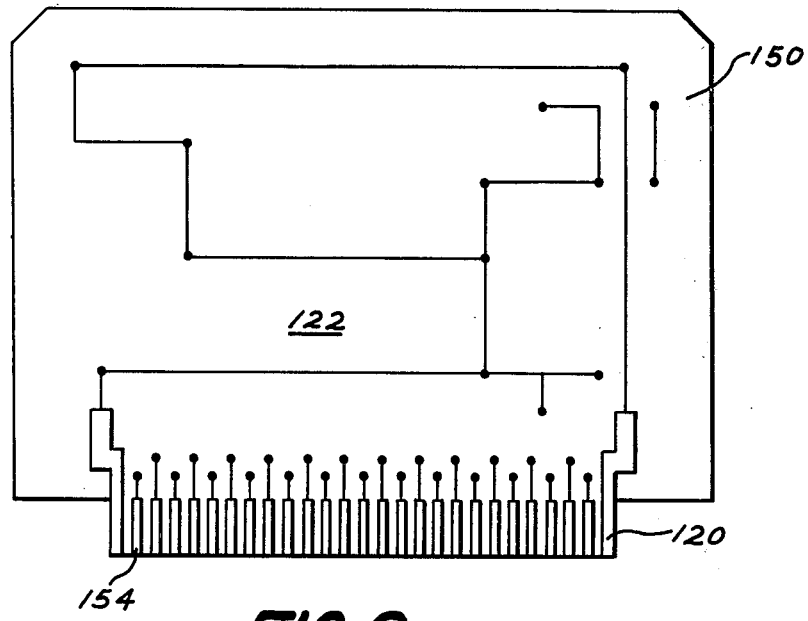
FIG. 6 is a front view of a typical printed circuit board which is used as one example of a sheet-like workpiece having a lengthwise portion for selectively plating portions thereof, such as the electrical terminals arranged along the bottom edge of the board.

One example of a sheet-like workpiece or PC board to be processed by this plating machine 10 is shown in FIG. 6 as element 122. It has a thin insulating sheet or board 150 to which is assembled a printed circuit and later discrete electronic components as is well established in this art. One longitudinal edge 120 is provided with a plurality of copper terminals 154 which are to be plated with a noble metal such as gold, silver or platinum.

Figure 7:
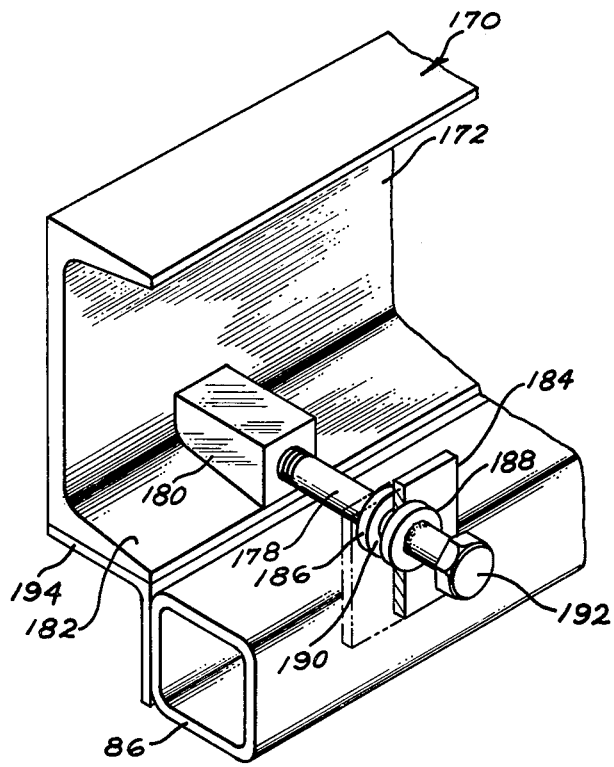
FIG. 7 is a fragmentary perspective view of a means for adjusting the horizontal position of one of the channel beams of the backup guide of one of the tractor treads for accommodating workpieces of different thicknesses, as well as to adjust the clamping force between opposing clamping shoes.

As is seen in FIGS. 2 and 4, the clamping portion of each chain 30 and 32, where the opposing shoes engage each other, is provided with a backup guide 170 which insures a strong clamping force between the opposing shoes 34 and 36. Each backup guide 170 is furnished with a heavy channel beam 172 that is set up vertically on its side. A plastic strip 174 is fitted to the inner side of the beam, and is in engagement with the rollers 136 of the adjacent chain. Thus the relative position of each channel beam 172, 172 determines the clamping force between the opposing shoes 34 and 36. The left hand beam 172 is a fixed beam that is fixed to an angle iron 176, that is in turn welded to the side of the box beam 84. The right hand beam 172 is a horizontally adjustable beam as is shown in FIG. 7. An adjusting bolt 178 is threaded at one end into a threaded block 180 that is fixed to the lower flange 182 of the beam. A vertical slotted plate 184 is fixed to the outer side of the box beam 86. The bolt 178 has a pair of spaced shoulders 186 and 188 so when the bolt 178 is positioned in the slot 190 the shoulders capture the plate 184 therebetween. The other end of the bolt 178 has a bolt head 192 for engagement by a suitable wrench so that by turning the bolt, the threads of the bolt will move in or out of the block 180 thereby shifting the right hand beam 172 toward or away from the other beam 172. Of course, there would be another adjustable bolt 178 near the opposite end of the right hand beam, and perhaps a plurality of such bolts spaced along the length of the beam. The fact remains that at least one of the backup guides 170 is adjustably mounted for varying the clamping action or pressure between opposing shoes 34 and 36 depending upon the thickness of the workpieces 122 to be accommodated by this machine.

An additional compression force is exerted inwardly against each bottom portion of each clamping shoe to make up for the clearances and tolerances in the parts of the tractor treads 26 and 28, as well as for the wear of these parts during extended operations of the equipment. Looking at FIG. 2, the bottom of each elongated square bar 198 and 210 is provided with an angle iron 218 and 220 respectively. On the lower edge of each angle iron is a rubber molding 222 and 224 respectively which has a wiping action against the rear side of the bottom portion of the adjacent clamping shoes 36 and 34 respectively.

This right hand beam 172 is fixed to an angle iron 194 but this beam is not fixed to the box beam 86. Perhaps additional sliding support means could be added between the angle iron 194 and beam 86 to support the weight of the right hand backup guide 170.

Each backup guide 170 also serves to limit the vertical movement of the clamping portion of each chain, as is best understood from the transverse view of FIG. 2. Below the chain 32 is an elongated square bar 198 that is fixed to the inner side of the right hand beam 172. On top of this bar is an elongated, extruded plastic strip 200 that is formed with a top groove 202. The chain 32 rides on the top surface of this plastic strip 200 and the groove 202 is present to accommodate the bottom end of the pivot pins 134.

Above the chain 32 is a similar arrangement, an elongated square bar 204 and an inverted plastic strip 206 with a bottom groove 208.

The other chain 30 has similar bars 210 and 212 and similar under and over plastic strips 214 and 216.

A suitable drive motor and speed reduction assembly (not shown) would be provided for the dual tractor treads 26 and 28 to power them at a constant slow speed of about 3 feet per minute.

Modifications of this invention will occur to those skilled in this art. Therefore, it is to be understood that this invention is not limited to the particular embodiments disclosed, but that it is intended to cover all modifications which are within the true spirit and scope of this invention as claimed.

What is claimed is:

1. Continuous plating machine including an anode means, a cathode means and a source of electrical current, for selectively plating a lengthwise portion of a plurality of discrete sheet-like workpieces comprising:
   a. base frame means;
   b. conveyor means supported from the base frame means and comprising interacting endless tractor tread means having clamping shoes which capture the workpieces therebetween and transport them therealong, with the selected portion of the workpieces to be plated extending out from between the interacting tread means;
   c. backup guide means for selected portions of the interacting tread means to insure a strong clamping action on the workpieces throughout their travel;
   d. plating cell means cooperating with the conveyor means for distributing plating solution onto the exposed portion of the workpieces;
   e. said anode means being in operative relation with the cell means and connected to the current source;
   f. the workpieces being the said cathode means and electrically connected back through the conveyor means to the current source.

2. The invention of claim 1, wherein the endless tractor tread means comprises a pair of endless chains, each chain supporting a plurality of shoes in close alignment with each other, each shoe having a clamping face adapted for engagement with the other clamping face, and motor drive means for the said chains.

3. The invention of claim 2, wherein both endless chains lie side by side in the same generally horizontal plane, and the shoes are generally vertically arranged so that the selected portion of the workpiece to be plated extends down from the clamping shoes into proximity with the plating cell means, and the clamping shoes serve as masking means to protect the portions of the workpiece not requiring plating.

4. The invention of claim 3 wherein the clamping face of each shoe is provided with a resilient insulating surface, certain of the shoes substantially engaging each other along the adjacent sides thereof when these certain shoes are in a workpiece clamping position interacting with the shoes of the opposite endless chain.

5. The invention of claim 4 wherein a compression means bears against the bottom edge of each clamping shoe when the shoe is in its workpiece clamping position to increase the clamping action on the workpiece.

6. The invention of claim 5 wherein the backup guide means stabilizes the portion of the endless chain which supports the clamping shoes in the workpiece clamping position so that these clamping shoes are substantially restricted from vertical movement and movement away from the opposing clamping shoe.

7. The invention of claim 6 wherein each clamping shoe has a metal back support plate and an insulating lining with a lower flange underlying the back support plate to shield the support plate from the plate solution.

8. The invention of claim 1 wherein at least one of said backup guide means is adjustably mounted from the base frame means to vary the clamping pressure between opposing clamping shoes so as to accomodate different sizes and thicknesses of workpieces.

9. The invention of claim 2 wherein each clamping face of each shoe comprises a resilient insulating layer for engaging one side of the workpiece, the side edges of each shoe being generally vertically arranged and each side edge being tapered to a narrow longitudinal edge, while the tapered side edge of one shoe generally mates with the tapered side edge of the adjacent shoe.

10. The invention of claim 1, wherein the conveyor means extends lengthwise for substantially the entire length of the machine, and the workpieces are loaded into the conveyor means at one end of the machine and are unloaded from the conveyor means at the other end of the machine, the plating machine comprising a plurality of process stations so that the conveyor means provides continuous movement of the workpieces through entire stripping, cleaning, activation, plating and rinse cycles.

11. The invention of claim 1, wherein the plating cell is supplied with plating solution through elongated piping means extending the length of the cell adjacent each side of the selected portion to be plated of the workpieces, the cell being flooded and allowed to overflow into a plating tank and be recirculated, the selected portion of the workpieces being generally immersed in the plating solution as they travel through the plating cell with the conveyor means.

12. The invention of claim 11, wherein each end wall of the plating cell is provided with a weir over which the workpieces travel in entering and leaving the plating cell with the conveyor means.

13. The invention of claim 1, wherein the conveyor means is adapted to be loaded by a continuous file of discrete workpieces in close side by side relation, and the conveyor means is adapted to move at a substantially constant slow speed.

14. The subcombination of a clamping shoe for use with a negatively charged endless tractor tread conveyor of a continuous electroplating machine, the clamping shoe comprising:
   a. an inner dielectric clamping face;
   b. an outer support plate;
   c. an electrically conductive pad extending across a portion of said clamping face for making electrical contact with said workpiece; and
   d. an electrically conductive means in operative relationship with said pad for impressing a negative charge on said workpiece.

15. The invention of claim 14, in which said inner dielectric face comprises a layer of resilient rubber.

16. The invention of claim 14, in which said support plate is a metal electrically conductive plate in conductive electrical relationship with said negatively charged conveyor.

17. The invention of claim 14, in which said electrically, conductive pad is a strip of silver impregnated rubber disposed transversely across the lower portion of said dielectric clamping face.

18. The invention of claim 14, in which said clamping show includes an intermediate layer of dielectric resin.

19. The invention of claim 18, in which said layer of dielectric resin includes upper and lower projecting flanges for support of said outer support plate in insulated relation.

20. The invention of claim 14, wherein each shoe has side edges tapered to a narrow longitudinal edge so that the tapered side edge of one shoe generally mates with the tapered side edge of an adjacent shoe.

21. A method for selectively plating discrete surface portions of a plurality of workpieces, which comprises the steps of:
   a. feeding said workpieces into an interacting endless tractor tread conveyor system having opposed treads disposed in clamping relation;
   b. grasping said workpieces into clamping and masking engagement between clamping shoes having dielectric resilient faces with selected portions of said workpieces to be plated extending out from said tractor treads, and moving said workpieces through a predetermined path;
   c. flooding selected stations along said predetermined path with treatment fluids for contact with the exposed discrete portions of said workpieces;
   d. flooding selected stations along said predetermined path with electrolyte solution for establishing a flow of electrolyte solutuion across the exposed portion of said workpieces.
   e. maintaining selective conductive areas across the dielectric clamping faces of said treads and establishing electrical contact for said conductive areas through said dielectric treads to a power source;
   f. impressing a negative charge on said workpieces;
   g. positively charging said electrolyte solution to cause a plating current between said electrolyte solution and said negatively charged workpieces.

22. The method of claim 21, in which said treatment fluids include acid solutions in at least one station.

23. The method of claim 21, in which said treatment solution comprises aqueous rinses between selected stations.

24. The method of claim 21, in which said electrolyte solution comprises positively charged nickel cation in at least one station.

25. The method, as defined in claim 21, in which said electrolyte solution comprises positively charged gold cations in at least one station.

26. The method of claim 21, in which the steps of moving said workpieces sequentially through flooded stations includes:
   a. an acid bath;
   b. thence to a positively charged electrolyte solution nickel cations;
   c. thence through one or more stations of electrolyte solutions containing positively charged gold cations, and
   d. rinsing said workpieces with water between stations.

* * * * *